United States Patent [19]
Devries

[11] Patent Number: 4,890,305
[45] Date of Patent: Dec. 26, 1989

[54] DUAL-TRACKING PHASE-LOCKED LOOP
[75] Inventor: Paul A. Devries, Wayne, Mich.
[73] Assignee: Northern Telecom Limited, Montreal, Canada
[21] Appl. No.: 155,575
[22] Filed: Feb. 12, 1988
[51] Int. Cl.$^4$ .............................................. H03D 3/24
[52] U.S. Cl. .................................. 375/120; 331/1 A; 375/82
[58] Field of Search ...................... 375/81, 82, 83, 86, 375/119, 120, 108; 331/1 A, 14, 18, 25; 364/715

[56]           References Cited
        U.S. PATENT DOCUMENTS

| | | | |
|---|---|---|---|
| 3,646,452 | 2/1972 | Horowitz et al. | 375/120 |
| 4,135,166 | 1/1979 | Marchetti | 331/14 |
| 4,151,485 | 4/1979 | LaFratta | 375/120 |
| 4,357,707 | 11/1982 | Delury | 375/119 |
| 4,418,318 | 11/1983 | Swagerty et al. | 364/715 |
| 4,456,890 | 6/1984 | Carickhoff | 375/120 |
| 4,503,400 | 3/1985 | Edwards et al. | 331/14 |

Primary Examiner—Benedict V. Safourek
Assistant Examiner—Stephen Chin
Attorney, Agent, or Firm—Saidman, Sterne, Kessler & Goldstein

[57]           ABSTRACT

A dual-tracking phase-locked loop circuit is provided for moving with minimum disruption from conventional PLL operation to processor-controlled tracking of another closely related clock. In addition to conventional PLL components the circuit comprises a processor-controlled up/down counter which may operate alternatively as a link in the loop or as providing the base-line frequency determining value at the time of transition from PLL to processor-controlled tracking operation, thereby ensuring none disruptive transition.

6 Claims, 1 Drawing Sheet

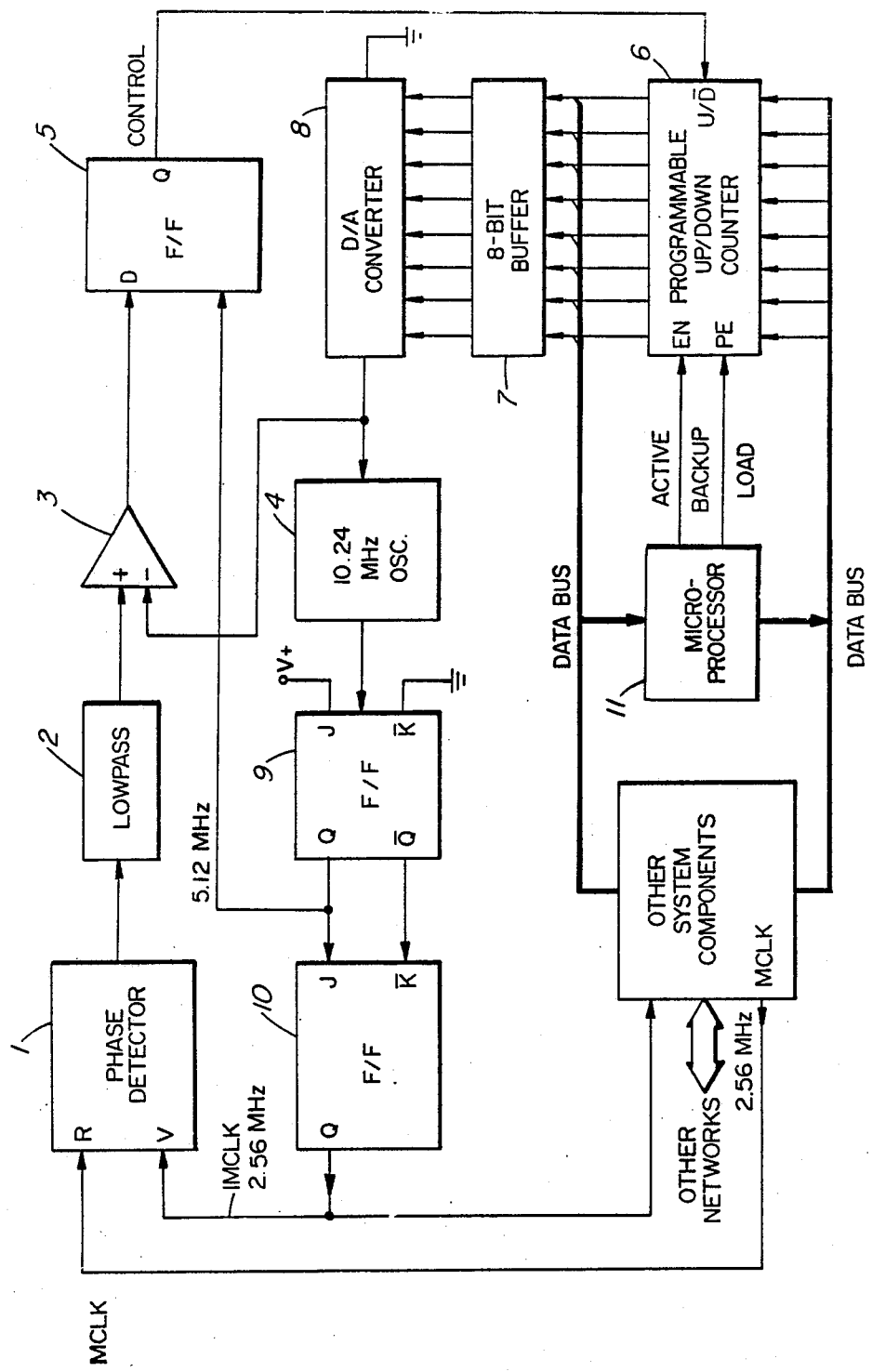

DUAL-TRACKING PHASE-LOCKED LOOP

BACKGROUND OF THE INVENTION

1. Field of the Invention

The present invention relates to phase-locked loop (PLL) clocking circuits in general and in particular to a PLL clock circuit capable of adjusting its frequency to lock onto either of two sources with a minimum of disturbance to the phase of its output clock signal.

2. Related Art

In telephony systems it is often required to have the local clock follow a primary master clock provided by a larger, often remote, network. For example, in U.S. Pat. No. 4,519,071 for Phase-Locked Loop and Clock Circuit For A Line Switch, issued May 21, 1985 to Miller, a phase-locked loop circuit permits clock signals which are generated in a line switch module to be in phase synchronism with any one of a number of PCM lines. A processor is provided to control clock generation and to select which of the PCM lines is used to provide clock signals.

In U.S. Pat. No. 3,936,604 entitled Synchronization Of Clocks in Digitial Signalling Networks, issued Feb. 3, 1976 to Pommerening, a station scans all available clock signals, its own and all those derived from the incoming data signals, compares the scanned signals one by one with its own operating rate, and adjusts the rate to conform to the slowest signal.

In certain telephony system, where reliability requirements are high, it is necessary to provide dual, redundant, system components. For example, in Northern Telecom's DV-1 system, where voice and data signals are transferred over a synchronous system bus, it is necessary to provide dual processors; a primary processor and a back-up processor. The primary processor must adjust its clock to maintain synchronism with the larger telephony network, while the back-up processor must tighly lock to and track the primary processor clock in order to be able to become the active processor without disrupting the system operation should the primary processor for any reason loose sanity or become disabled. For reasons of economy, it is desirable that the PLL circuits in both primary and back-up processors be identical.

SUMMARY OF THE INVENTION

The present invention provides a dual-tracking phase-locked loop which satisfies the above mentioned requirements. The identical dual-tracking PLL circuit will be adjusting its clock frequency through a digital latch value to maintain synchronism with the larger telephony network if in the active, primary processor. If in the back-up processor, the circuit will lock tightly to the clock it receives on the system bus from the active unit. Thus should the back-up unit have to step in and provide clocking to the bus for any reason, the transition will be accomplished with minimal disruption because its clock was tightly locked to the previous clock. At the same time the back-up PLL will be immediately in a position to start tracking the clock of the larger telephony network. The dual-tracking PLL circuit therefore can adjust its frequency in response to the digital latch value, which is under the control of the processor, or in response to the clock it receives on the system bus.

The dual-tracking function is provided by a PLL circuit comprising: phase detection means responsive to the phases of active and back-up clock signals; comparator means responsive to said phase detection means and to programmable counter means counting up or down in response to said comparator means; and oscillator means responsive to said programmable counter means for providing said back-up clock signal.

The programmable counter means preferably comprises a microprocessor for latching a digital value in an up/down counter in response to changes in a master clock recovered from an incoming data stream, and a digital-to-analog (D/A) converter for converting the latched digital value to an analog value for controlling the frequency of said oscillator means.

The programmable up/down counter acts, by counting up or down, to adjust the frequency of the local oscillator to yield, after division, a back-up clock signal locked to the active clock signal. However, at the moment the back-up unit takes over, the last value in the counter is frozen and the counter henceforth acts merely as a digital latch in which the stored value is updated as needed by the microprocessor in order to track the incoming master clock extracted from the incoming data stream by clock recovery circuits. Usually such incoming data stream would be one emanating from a larger, more central and often remote, telephony network or the like node. In this latter mode of operation the up/down counter is inhibited from counting and the operation of the phase detection means and comparator means cease to affect the oscillator means and, hence, also the back-up clock.

In its broad aspect, therefore, the present invention provides a dual-tracking phase-locked loop (DTPLL), CHARACTERIZED BY a phase-locked loop (PLL) circuit wherein a clock determining voltage-controlled oscillator (VCO) is controlled by a stored digitally encoded value determined from phase comparison in the PLL circuit, wherein the stored digitally encoded value ceases at a predetermined time to be determined from said phase comparison and is determined instead by a microprocessor, whereby said clock exhibits minimal disruption at said predetermined time.

BRIEF DECRIPTION OF THE DRAWING

The preferred embodiment will now be described in detail in conjunction with the attached drawing figure, which is a block schematic of a dual-tracking phase-locked loop (DTPLL) according to the present invention.

DETAILED DESCRIPTION OF THE PREFERRED EMBODIMENT

Referring now to the single drawing figure, the DTPPL comprises a phase detector 1 receiving the active clock MCLK and the inactive IMCLK signals at its R and V inputs, respectively. As usual in PLL circuits the output of the phase detector 1 is applied to a lowpass filter 2, the output of which is applied to the non-inverting input of an analog comparator 3, the inverting input of which receives the same signal applied to control a voltage controlled oscillator (VCO) 4 (10.24 Mltz). The output of the analog comparator 3, which switches between two states, is applied to a flip-flop 5 which clocks in the logic state at the output of the comparator 3 and produces a control signal at its Q-output to cause a programmable up/down counter 6 to count either up or down depending on the state of the Q-output. The digital value in the up/down counter 6 is applied via an 8-bit buffer 7 to an R-2R ladder network D/A converter 8, the analog output signal of which controls the frequency/phase of the VCO 4 until altered by a new digital value in the counter 6. The 10.24 MHz output signal of the oscillator 4 is divided by two in flip-flop 9 and again by two in flip-flop 10, the Q-output of which, being nominally 2.56 MHz, is the inactive clock IMCLK, that is in a back-up DTPLL. A microprocessor 11 (in the back-up system unit) controls the up/down counter 6 by enabling it to count (back-up) or disabling it when the back-up unit is active. The microprocessor 11 also loads 8-bit digital values into the counter 6 and reads the values therein by means of the system data bus. Of course other system components 12 are also served by the data bus; while the system as a whole communicates with other networks via bidirectional data links. Both the active MCLK and inactive IMCLK clocks are available throughout the active (primary) and back-up systems; the microprocessor 11 determines which is MCLK and which is IMCLK, by disabling or activating the respective up/down counter 6 (shown here in the back-up system).

OPERATION

In the active mode, the programmable up/down counter 6 is disabled as a counter by the microprocessor 11 and operates as a digital latch. Through the data bus the microprocessor 11 writes a predetermined 8-bit digital value into the counter. That value appears at the output of the counter and is buffered by the 8-bit buffer 7 to the D/A converter 8, which is in fact a R-2R ladder network comprised of nine 2 Kohm and seven 1 Kohm resistors in a well known manner. The CMOS buffer 7 provides close to power supply voltage levels to the R-2R ladder network. The analog voltage at the output of the D/A converter 8 is applied directly to the voltage controlled oscillator 4, having a nominal frequency of 10.24 MHz. Thus, in this mode, the microprocessor 11 directly controls the frequency of the VCO 4 by writing an 8-bit digital value into the latch/counter 6.

In back-up mode, the conventional PLL circuit tracks the clock received on the system bus closely. If the only function required of the PLL circuit was to track the clock MCLK, the analog output of the lowpass filter 2 would have been applied directly to the VCO 4. In the present case, it was necessary to be able to switch the control of the VCO 4 from the lowpass filter 2 of the PLL to the latched values from the microprocessor 11. In order to achieve a smooth transition in both frequency and phase from back-up mode to active mode, it is necessary that the digital value in the up/down counter 6 at the moment of switchover be the value required to make the VCO 4 run at exactly the right frequency. Since that requires that the circuit update the counter continuously on what that value is, the up/down counter 6 was made an intergral part of the PLL circuit.

To achieve this, the output of the lowpass filter 2, applied to the non-inverting input of the analog comparator 3, is compared to the input voltage controlling the VCO 4, which is the analog representation of the digital 8-bit value stored in the up/down counter 6. In the back-up mode, the counter 6 will count up or down in response essentially to the result of the comparison in the comparator 3. Thus, if the Q-output of the flip-flop 5 is high, the up/down counter 6 will count up, causing the output of the D/A converter 8 to increase each time by the incremented count. As the clock MCLK changes frequency following the larger telephony network, the counter 6 will follow by incrementing or decrementing its count as the output of the comparator 3 dictates, causing the IMCLK to remain closely locked to the frequency of MCLK. Should the circuit under the control of the microprocessor 11 switch from back-up to active, the 8-bit value stored in the counter 6 at the time is frozen and read by the microprocessor 11 to be used as the base-line value from which adjustments are made as is necessary to track the clocking of the larger network.

What is claimed is:

1. A dual-tracking phase-locked loop (DTPLL), comprising: phase detection means responsive to the phases of active and back-up clock signals; comparator means responsive to said phase detection means and to programmable counter means counting up or down in response to said comparator means; oscillator means responsive to said programmable counter means for providing said back-up clock signal; and said programmable counter means comprising a microprocessor for latching a digital value in an up/down counter in response to change in a master clock recovered from an incoming data stream, and a digital-to-analog (D/A) convertor for converting the latched value to an analog value for controlling the frequency of said oscillator means so that when the microprocessor senses said changes in said master clock and latches said digital value, it inhibits the up/down counter from counting and causes said phase detection means and said comparator means to cease to affect said oscillator means.

2. A dual-tracking phase-locked loop (DTPLL), comprising: a phase-locked loop (PLL) circuit wherein a clock determining voltage-controlled oscillator (VCO) is controlled by a digitally encoded value determined by a phase comparator in the PLL circuit comparing an active clock and said VCO, said digitally encoded value is stored in an up/down counter, and wherein the digitally encoded value ceases, at a predetermined time, to be determined by said phase comparator and is determined instead by a microprocessor means for controlling said up/down counter, whereby the VCO clock exhibits minimal disruption at said predetermined time.

3. The DTPLL as defined in claim 2, said up/down counter being a programmable up/down counter.

4. The DTPLL as defined in claim 3, said progammable up/down counter being inserted in and out of said PLL by being enabled and disabled, respectively, by said microprocessor.

5. The DTPLL as defined in claim 4, said programmable up/down counter being enabled by said microprocessor when said DTPLL is in back-up mode.

6. The DTPLL as defined in claims 4 or 5, said programmable up/down counter being disabled at said predetermined time when said DTPLL is to provide the VCO clock under control of said microprocessor.

* * * * *